United States Patent
Lei et al.

(10) Patent No.: US 11,355,394 B2
(45) Date of Patent: Jun. 7, 2022

(54) WAFER DICING USING HYBRID LASER SCRIBING AND PLASMA ETCH APPROACH WITH INTERMEDIATE BREAKTHROUGH TREATMENT

(71) Applicant: Applied Materials, Inc., Santa Clara, CA (US)

(72) Inventors: Wei-Sheng Lei, San Jose, CA (US); Brad Eaton, Menlo Park, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 305 days.

(21) Appl. No.: 16/516,926

(22) Filed: Jul. 19, 2019

(65) Prior Publication Data

US 2020/0091001 A1 Mar. 19, 2020

Related U.S. Application Data

(60) Provisional application No. 62/730,827, filed on Sep. 13, 2018.

(51) Int. Cl.
*H01L 21/3213* (2006.01)
*H01L 21/82* (2006.01)

(52) U.S. Cl.
CPC ........ *H01L 21/82* (2013.01); *H01L 21/32137* (2013.01); *H01L 21/32139* (2013.01)

(58) Field of Classification Search
CPC ............... H01L 21/82; H01L 21/32137; H01L 21/32139
See application file for complete search history.

(56) References Cited

U.S. PATENT DOCUMENTS

| | | |
|---|---|---|
| 4,049,944 A | 9/1977 | Garvin et al. |
| 4,339,528 A | 7/1982 | Goldman |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining," www.small-journal.com, 2005, 1, No. 7, 7 pgs.

(Continued)

*Primary Examiner* — Mohammad M Choudhry
(74) *Attorney, Agent, or Firm* — Schwabe, Williamson & Wyatt, P.C.

(57) ABSTRACT

Methods of dicing semiconductor wafers, each wafer having a plurality of integrated circuits, are described. In an example, a method of dicing a semiconductor wafer having a plurality of integrated circuits involves forming a mask above the semiconductor wafer, the mask including a layer covering and protecting the integrated circuits. The mask is patterned with a laser scribing process to provide a patterned mask with gaps, exposing regions of the semiconductor wafer between the integrated circuits. Subsequent to patterning the mask, a breakthrough treatment is performed, the breakthrough treatment comprising a first physical bombardment operation, a second iterative isotropic and directional plasma etch operation, and a third directional breakthrough operation. Subsequent to performing the breakthrough treatment, the semiconductor wafer is plasma etched through the gaps in the patterned mask to singulate the integrated circuits.

20 Claims, 14 Drawing Sheets

(a)

(b)

(56) References Cited

U.S. PATENT DOCUMENTS

| | | |
|---|---|---|
| 4,684,437 A | 8/1987 | Donelon et al. |
| 5,336,638 A | 8/1994 | Suzuki et al. |
| 5,593,606 A | 1/1997 | Owen et al. |
| 5,691,794 A | 11/1997 | Hoshi et al. |
| 6,051,503 A | 4/2000 | Bhardwaj et al. |
| 6,057,180 A | 5/2000 | Sun et al. |
| 6,174,271 B1 | 1/2001 | Kosmowski |
| 6,300,593 B1 | 10/2001 | Poweli |
| 6,306,731 B1 | 10/2001 | Igarashi et al. |
| 6,407,363 B2 | 6/2002 | Dunsky et al. |
| 6,426,275 B1 | 7/2002 | Arisa |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,361,990 B2 | 4/2008 | Lu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,638 B2 | 3/2009 | Mancini et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,804,043 B2 | 9/2010 | Deshi |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,926,410 B2 | 4/2011 | Bair |
| 7,927,973 B2 | 4/2011 | Haji et al. |
| 8,975,163 B1 | 3/2015 | Lei et al. |
| 9,018,079 B1 * | 4/2015 | Lei .......... H01L 21/78 438/462 |
| 2003/0162313 A1 | 8/2003 | Kim et al. |
| 2004/0080045 A1 | 4/2004 | Kimura et al. |
| 2004/0137700 A1 | 7/2004 | Sekiya |
| 2004/0157457 A1 | 8/2004 | Xu et al. |
| 2004/0212047 A1 | 10/2004 | Joshi et al. |
| 2005/0112884 A1 * | 5/2005 | Gormley ............ H01L 21/3086 438/689 |
| 2006/0043535 A1 | 3/2006 | Hiatt |
| 2006/0086898 A1 | 4/2006 | Cheng et al. |
| 2006/0088984 A1 | 4/2006 | Li et al. |
| 2006/0146910 A1 | 7/2006 | Koochesfahani et al. |
| 2006/0205182 A1 | 9/2006 | Soejima |
| 2008/0213978 A1 | 9/2008 | Henry et al. |
| 2009/0255911 A1 | 10/2009 | Krishnaswami et al. |
| 2010/0013036 A1 | 1/2010 | Carey |
| 2010/0216313 A1 | 8/2010 | Iwai et al. |
| 2010/0248451 A1 | 9/2010 | Pirogovsky et al. |
| 2011/0014777 A1 | 1/2011 | Haji et al. |
| 2011/0312157 A1 | 12/2011 | Lei et al. |
| 2013/0045554 A1 | 2/2013 | Yamazaki |
| 2013/0065378 A1 | 3/2013 | Johnson et al. |
| 2013/0230972 A1 | 9/2013 | Johnson et al. |
| 2014/0017881 A1 | 1/2014 | Eaton et al. |
| 2015/0214109 A1 * | 7/2015 | Lei ................ H01L 21/3086 438/462 |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| KR | 10-2009-0025518 A | 3/2009 |
| WO | WO-03036712 | 5/2003 |
| WO | WO-03071591 | 5/2003 |
| WO | WO 2015/116378 | 8/2015 |
| WO | WO 2015/116457 | 8/2015 |

OTHER PUBLICATIONS

Singh, Saravjeet et al., "Apparatus and Methods for Dry Etch With Edge, Side and Back Protection," U.S. Appl. No. 61/491,693, filed May 31, 2011 24 pgs.

International Preliminary Report on Patentability from Patent Application No. PCT/US2019/044889 dated Mar. 25, 2021, 7 pgs.

International Search Report and Written Opinion from PCT/US2019/044889 dated Nov. 20, 2019, 10 pgs.

Extended European Search Report from Application No. 19858858.4 dated Apr. 28, 2022, 10 pgs.

* cited by examiner $$I = \frac{E_p}{\pi \cdot w_0^2 \cdot \tau}$$

Intensity — $I$
Pulse Energy — $E_p$
Beam Radius — $w_0$
Pulse Width — $\tau$

WAFER DICING USING HYBRID LASER SCRIBING AND PLASMA ETCH APPROACH WITH INTERMEDIATE BREAKTHROUGH TREATMENT

CROSS-REFERENCE TO RELATED APPLICATIONS

This application claims the benefit of U.S. Provisional Application No. 62/730,827, filed on Sep. 13, 2018, the entire contents of which are hereby incorporated by reference herein.

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and wafer real estate that could otherwise be used for circuitry is wasted. The use of a saw exacerbates the waste of real estate on a semiconductor wafer. The blade of the saw is approximate 15 microns thick. As such, to insure that cracking and other damage surrounding the cut made by the saw does not harm the integrated circuits, three to five hundred microns often must separate the circuitry of each of the dice. Furthermore, after cutting, each die requires substantial cleaning to remove particles and other contaminants that result from the sawing process.

Plasma dicing has also been used, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

Embodiments of the present invention include methods of dicing semiconductor wafers, each wafer having a plurality of integrated circuits thereon.

In an embodiment, a method of dicing a semiconductor wafer having a plurality of integrated circuits involves forming a mask above the semiconductor wafer, the mask including a layer covering and protecting the integrated circuits. The mask is patterned with a laser scribing process to provide a patterned mask with gaps, exposing regions of the semiconductor wafer between the integrated circuits. Subsequent to patterning the mask, a breakthrough treatment is performed, the breakthrough treatment comprising a first physical bombardment operation, a second iterative isotropic and directional plasma etch operation, and a third directional breakthrough operation. Subsequent to performing the breakthrough treatment, the semiconductor wafer is plasma etched through the gaps in the patterned mask to singulate the integrated circuits.

In another embodiment, a system for dicing a semiconductor wafer having a plurality of integrated circuits includes a factory interface. A laser scribe apparatus is coupled with the factory interface and houses a laser. A first plasma etch chamber is coupled with the factory interface, the first plasma etch chamber configured for performing a breakthrough treatment, the breakthrough treatment comprising a first physical bombardment operation, a second iterative isotropic and directional plasma etch operation, and a third directional breakthrough operation. A second plasma etch chamber is coupled with the factory interface, the second plasma etch chamber configured for performing a deep silicon plasma etch operation.

In another embodiment, a method of dicing a semiconductor wafer having a plurality of integrated circuits involves forming a mask layer above a silicon substrate, the mask layer covering and protecting integrated circuits disposed on the silicon substrate. The integrated circuits include a layer of silicon dioxide disposed above a layer of low K material and a layer of copper. The method also involves patterning the mask layer, the layer of silicon dioxide, the layer of low K material, the layer of copper, and a portion of the silicon substrate with a laser scribing process to expose regions of the silicon substrate between the integrated circuits. Subsequent to performing the laser scribing process, a breakthrough treatment is performed, the breakthrough treatment comprising a first physical bombardment operation, a second iterative isotropic and directional plasma etch operation, and a third directional breakthrough operation. Subsequent to performing the breakthrough treatment, the silicon substrate is plasma etched through the exposed regions of the silicon substrate to singulate the integrated circuits.

DETAILED DESCRIPTION

Figure 1B:
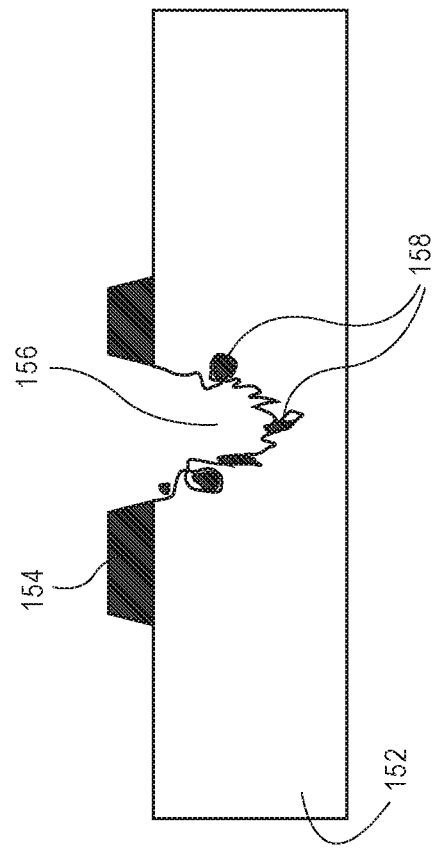
FIG. 1B illustrates a cross-sectional view of a masked wafer following a laser scribing mask patterning process.

Methods of dicing semiconductor wafers, each wafer having a plurality of integrated circuits thereon, are described. In the following description, numerous specific details are set forth, such as laser scribing, breakthrough etch, and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid wafer or substrate dicing process involving an initial laser scribe and subsequent plasma etch, with an intermediate post mask opening clean operation, may be implemented for die singulation. The laser scribe process may be used to cleanly remove a mask layer, organic and inorganic dielectric layers, and device layers. The laser etch process may then be terminated upon exposure of, or partial etch of, the wafer or substrate. The plasma etch portion of the dicing process may then be employed to etch through the bulk of the wafer or substrate, such as through bulk single crystalline silicon, to yield die or chip singulation or dicing.

One or more embodiments described herein are directed to a method of plasma dicing of semiconductor wafers with etch opening prepared by laser scribing.

To provide context, in a hybrid wafer dicing process, a first laser scribe process is introduced to remove a stack layers above a silicon (Si) substrate material on a mask-coated wafer. Next, a plasma etch process is implemented to form a through thick trench along the pre-opened dicing street. The plasma etching process includes two operations: first is a "breakthrough" (BT) operation which cleans a pre-opened trench surface to a level such that plasma etching of silicon proceeds with reasonable quality and throughput. Due to the inhomogeneity of stack, however, structures along dicing streets (e.g., alignment marks, test patterns, etc.) may vary in terms of material type and thickness of each layer. As a result, it is normal to obtain non-uniform trench depth and trench cleanliness ablated by a laser scribing process in different positions along a dicing street. The BT operation aims to remove foreign materials and expose the Si surface to enable smooth plasma etching process. Conventional BT processes, however, adopt directional plasma etching with certain bias power and using a gas mixture of Ar and $SF_6$. The Ar gas is adopted for physical bombardment, while $SF_6$ is used mainly for chemical etching. Both gases are targeted to remove foreign materials other than Si.

The above described approach works well for lithographically-prepared photoresist (PR) mask opening for typical plasma etching applications, such as through Si via (TSV) etching process, due to a very minor PR mask remaining on the smooth Si surface. However, the use of the above described BT approach faces great challenges when used for etch opening prepared by laser scribing on PR- or non-PR mask coated wafers. In particular, issues may arise due to the formation of a very rough trench formed by laser process in combination with a mask, metal, and dielectric residues residing in the trench and may form metallurgical connection with substrate. It has been discovered that simply adding BT time, or using a high source or bias power, or increasing gas flow rate does not achieve a satisfactory cleaning for an opening and may also bear a large cost of mask (thickness) consumption over the entire wafer.

Figure 1A:
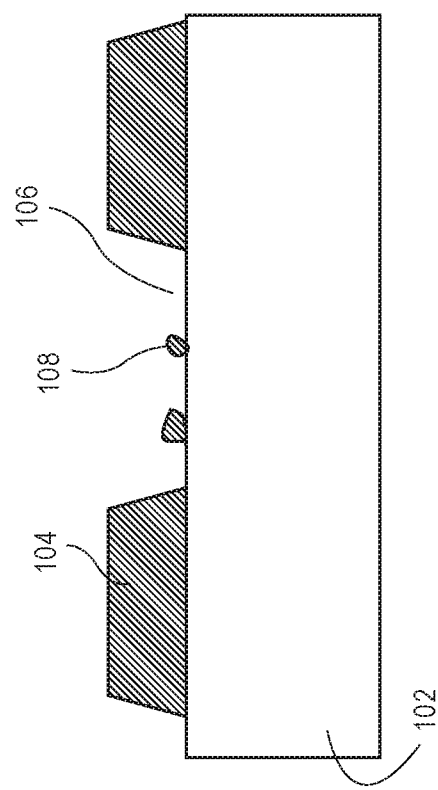
FIG. 1A illustrates a cross-sectional view of a masked wafer following a lithographic mask patterning process.

FIG. 1A illustrates a cross-sectional view of a masked wafer following a lithographic mask patterning process. Referring to FIG. 1A, a wafer 102 has a mask 104 thereon which has been patterned by a lithographic process. The smooth wafer surface 106 is exposed. Residues 108 of the mask 104 may be deposited on the smooth (mirror flat) wafer surface 106. A breakthrough (BT) treatment can work well for removal of the mask residues 108 since it is loosely attached on the smooth wafer surface 106.

FIG. 1B illustrates a cross-sectional view of a masked wafer following a laser scribing mask patterning process. Referring to FIG. 1B, a wafer 152 has a mask 154 thereon which has been patterned by a laser scribing process. A trench 156 is formed in the process. Residues 158 of the mask 104 may be deposited in the trench 156. It has been discovered that a breakthrough (BT) treatment does not work well for removal of the mask residues 158 since trench 156 is a very rough trench, and far from being mirror flat. For example, some of mask residues 158 may be trapped inside melted and then re-solidified dielectric and Si materials. On the surface of opened trench 156, there may be metals (e.g., from device layer), dielectric, Si melts, and mask residue, whereas some mask residue 158 may be buried or trapped by these materials. Essentially, in a BT operation following mask removal, a microscale etching of the entire trench 156 surface and dig out or removal of the trapped mask residues 158.

In accordance with an embodiment of the present disclosure, a breakthrough (BT) process is implemented with the advantages of (1) preserving a mask from noticeable consumption during the BT step, (2) shortening or maintaining conventional BT time, (3) achieving a clean trench opening feasible for high quality high throughput etch. It is to be appreciated that due to a rough wavy profile of a scribed trench, conventional BT via directional plasma bombardment/etching has been shown to not address the wavy details. As a result, contaminants or debris not in direct exposure to a BT plasma beam are not likely be removed, even with increased time.

To provide further context, in through-silicon-via (TSV) plasma etching or plasma wafer dicing, as well as other high aspect ratio deep silicon (Si) trench etching applications, a mask is often adhered onto the wafer surface and patterned. In the patterned area, the mask is removed and underlying Si substrate (which may include an $SiO_2$ layer) is exposed. During plasma etching, the Si substrate exposed in the patterned area is plasma etched while the non-patterned area is protected by the mask layer. One issue affecting plasma dicing quality (e.g., sidewall profile) and throughput is the cleanliness of patterned area. In the patterned area, often there exists mask residue, debris from laser scribing (e.g., in the case of a hybrid laser scribing and plasma etching singulation process), or other types of contamination atop the exposed Si surface. The mask residue or debris can affect the plasma etching process and cause imperfect etch profiles with defects, such as micro-grasses, by blocking the etchants from reaching the Si underneath mask residue or debris.

In accordance with an embodiment of the present disclosure, a multiple-operation breakthrough (BT) process is performed. In one embodiment, the breakthrough treatment includes a first physical bombardment operation, a second iterative isotropic and directional plasma etch operation, and a third directional breakthrough operation, exemplary embodiments of which are described below FIGS. 2A-2C illustrate cross-sectional views representing various operation of a laser scribe, breakthrough (BT) treatment, and deep plasma etch with a comparison provided for conventional versus a multi-operation BT treatment, in accordance with an embodiment of the present disclosure.

Figure 2A:
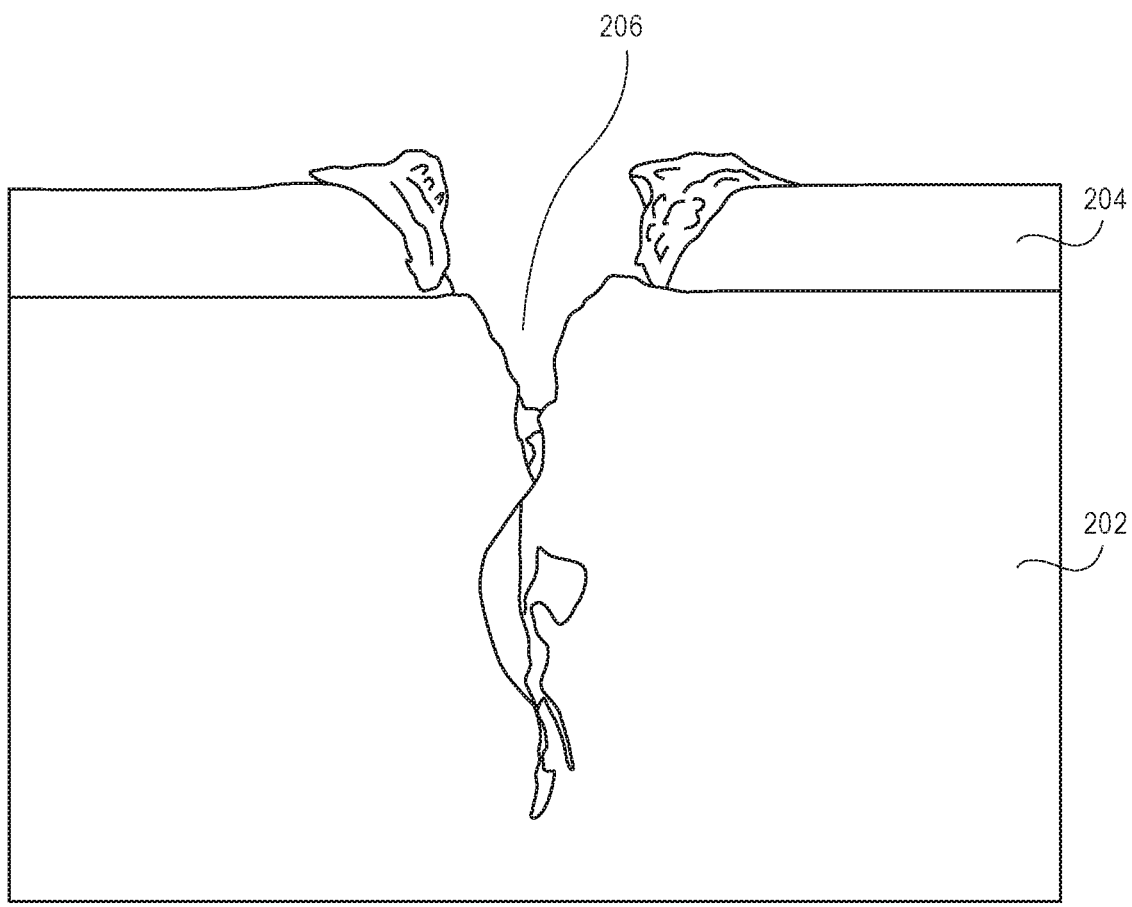
FIGS. 2A-2C illustrate cross-sectional views representing various operation of a laser scribe, breakthrough (BT) treatment, and deep plasma etch with a comparison provided for conventional versus a multi-operation BT treatment, in accordance with an embodiment of the present disclosure.

Referring to FIG. 2A, a silicon substrate 202 has a mask 204 thereon. A laser scribe 206 is formed through the mask 204 and partially into the silicon substrate 202.

Figure 2B:
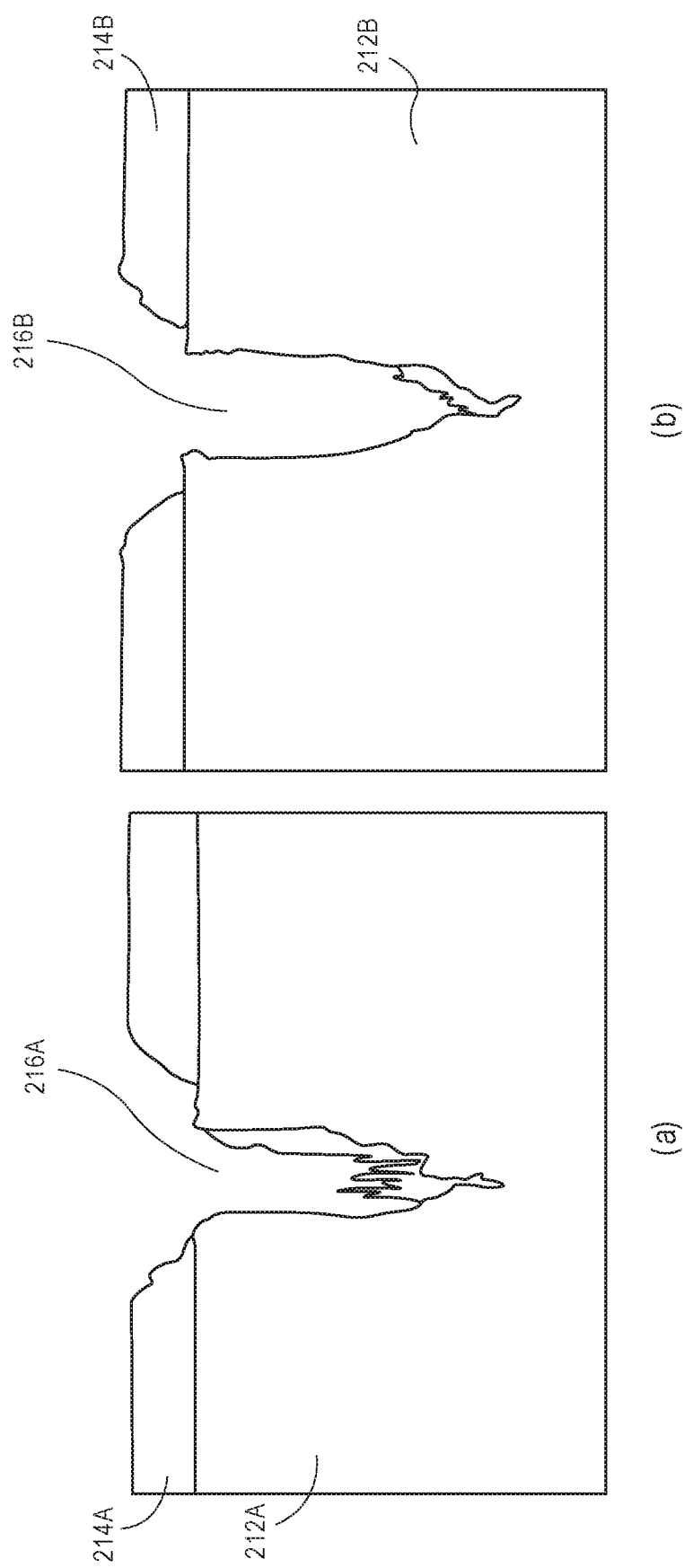

Referring to part (a) of FIG. 2B, the structure of FIG. 2A is subjected to a conventional breakthrough (BT) process to form scribed wafer 212A, treated mask 214A and BT treated trench 216A. The conventional BT process is performed for about 4 minutes and involves an Ar bombardment process. By contrast, referring to part (b) of FIG. 2B, the structure of FIG. 2A is subjected to a multi-operation breakthrough (BT) treatment to form scribed wafer 212B, treated mask 214B and BT treated trench 216B, in accordance with an embodiment of the present disclosure. The multi-operation BT treatment is performed for about 25 seconds. Examples of the multi-operation BT treatment are described below.

Figure 2C:
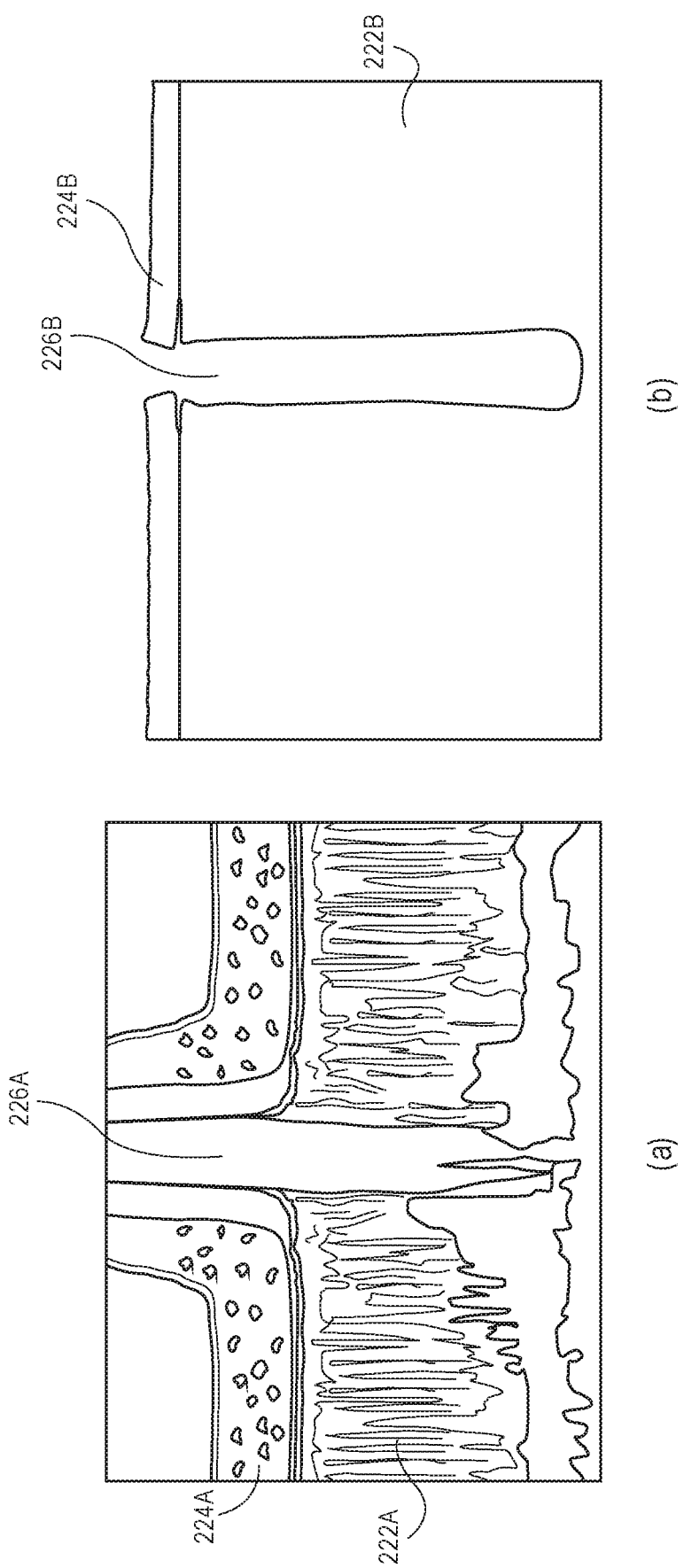

Referring to part (a) of FIG. 2C, the structure of part (a) of FIG. 2B is subjected to a deep plasma etch to form etched wafer 222A, plasma-bombarded mask 224A and deep trench 226A. The deep trench 226A has defects including grass features at the bottom of the trench. Referring to part (b) of FIG. 2C, the structure of part (b) of FIG. 2B is subjected to a deep plasma etch to form etched wafer 222B, plasma-bombarded mask 224B and deep trench 226B. The deep trench 226B is significantly smoother and accompanied with fewer to no defects.

More particularly, in an embodiment, a post-mask opening clean for a hybrid laser scribing and plasma etching die singulation process is used as a separate operation intermediate to the laser scribing and plasma etching aspects of the singulation process. The post-mask opening clean may also be referred to as a breakthrough (BT) plasma etch process that is performed between the laser scribing and plasma etching operations.

To provide broader context, conventional wafer dicing approaches include diamond saw cutting based on a purely mechanical separation, initial laser scribing and subsequent diamond saw dicing, or nanosecond or picosecond laser dicing. For thin wafer or substrate singulation, such as 50 microns thick bulk silicon singulation, the conventional approaches have yielded only poor process quality. Some of the challenges that may be faced when singulating die from thin wafers or substrates may include microcrack formation or delamination between different layers, chipping of inorganic dielectric layers, retention of strict kerf width control, or precise ablation depth control. Embodiments of the present invention include a hybrid laser scribing and plasma etching die singulation approach that may be useful for overcoming one or more of the above challenges.

In accordance with an embodiment of the present invention, a combination of laser scribing and plasma etching is used to dice a semiconductor wafer into individualized or singulated integrated circuits. In one embodiment, femtosecond-based laser scribing is used as an essentially, if not totally, non-thermal process. For example, the femtosecond-based laser scribing may be localized with no or negligible heat damage zone. In an embodiment, approaches herein are used to singulated integrated circuits having ultra-low k films. With convention dicing, saws may need to be slowed down to accommodate such low k films. Furthermore, semiconductor wafers are now often thinned prior to dicing. As such, in an embodiment, a combination of mask patterning and partial wafer scribing with a femtosecond-based laser, followed by a plasma etch process, is now practical. In one embodiment, direct writing with laser can eliminate need for a lithography patterning operation of a photo-resist layer and can be implemented with very little cost. In one embodiment, through-via type silicon etching is used to complete the dicing process in a plasma etching environment.

Figure 3:
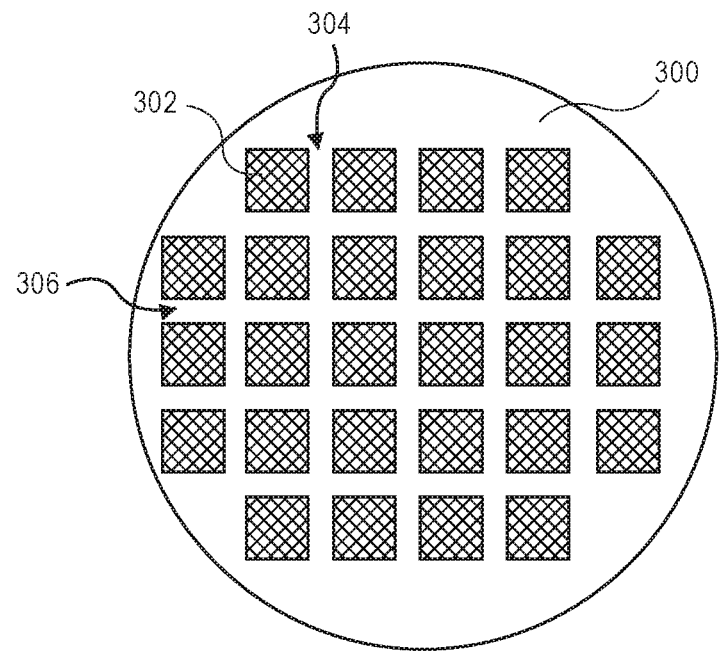
FIG. 3 illustrates a top plan of a semiconductor wafer to be diced, in accordance with an embodiment of the present invention.
Figure 4:
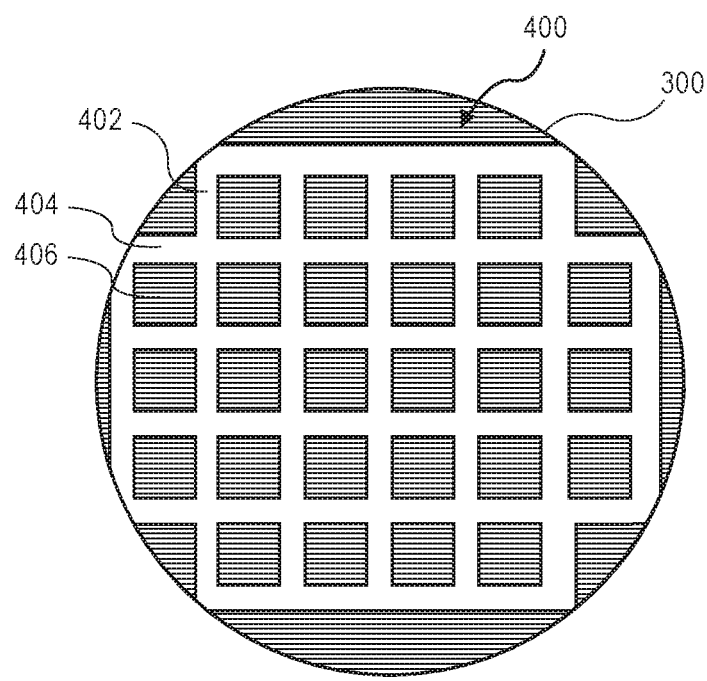
FIG. 4 illustrates a top plan of a semiconductor wafer to be diced that has a dicing mask formed thereon, in accordance with an embodiment of the present invention.

Thus, in an aspect of the present invention, a combination of laser scribing and plasma etching may be used to dice a semiconductor wafer into singulated integrated circuits. FIG. 3 illustrates a top plan of a semiconductor wafer to be diced, in accordance with an embodiment of the present invention. FIG. 4 illustrates a top plan of a semiconductor wafer to be diced that has a dicing mask formed thereon, in accordance with an embodiment of the present invention.

Referring to FIG. 3, a semiconductor wafer 300 has a plurality of regions 302 that include integrated circuits. The regions 302 are separated by vertical streets 304 and horizontal streets 306. The streets 304 and 306 are areas of semiconductor wafer that do not contain integrated circuits and are designed as locations along which the wafer will be diced. Some embodiments of the present invention involve the use of a combination laser scribe and plasma etch technique to cut trenches through the semiconductor wafer along the streets such that the dice are separated into individual chips or die. Since both a laser scribe and a plasma etch process are crystal structure orientation independent, the crystal structure of the semiconductor wafer to be diced may be immaterial to achieving a vertical trench through the wafer.

Referring to FIG. 4, the semiconductor wafer 300 has a mask 400 deposited upon the semiconductor wafer 300. The mask 400 and, possibly, a portion of the semiconductor wafer 300 are patterned with a laser scribing process to define the locations (e.g., gaps 402 and 404) along the streets 304 and 306 where the semiconductor wafer 300 will be diced. The integrated circuit regions of the semiconductor wafer 300 are covered and protected by the mask 400. The regions 406 of the mask 400 are positioned such that during a subsequent etching process, the integrated circuits are not degraded by the etch process. Accordingly, horizontal gaps 404 and vertical gaps 402 are formed between the regions 406 to define the areas that will be etched during the etching process to finally dice the semiconductor wafer 300. In accordance with embodiments described herein, a plasma cleaning operation is performed subsequent to the laser scribing but prior to the plasma etching used to singulate the individual integrated circuits 302. The plasma cleaning operation may be reactive or non-reactive to the portions of the semiconductor wafer 300 exposed by the horizontal gaps 404 and the vertical gaps 402 of the mask 400.

Figure 5:
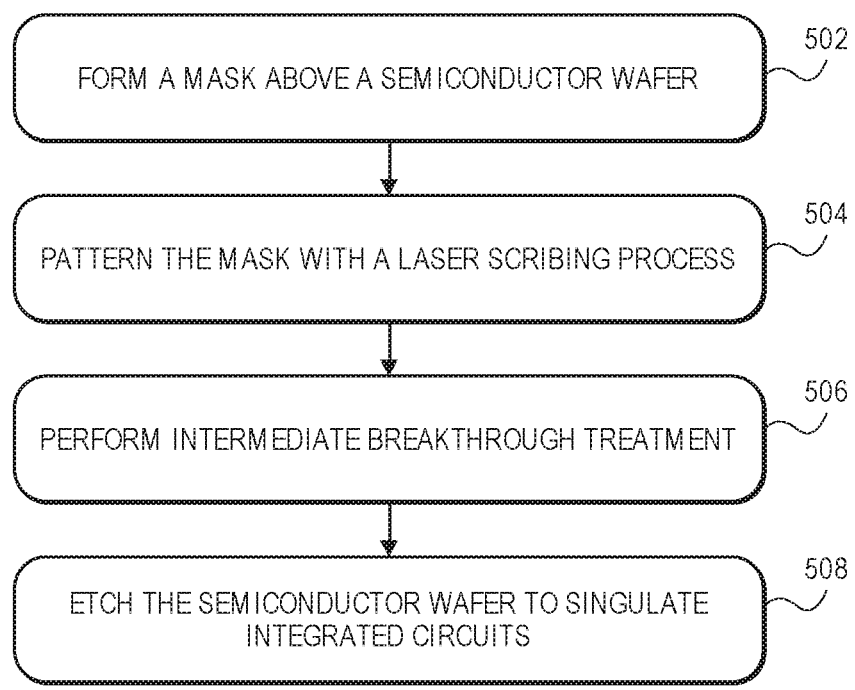
FIG. 5 is a Flowchart representing operations in a method of dicing a semiconductor wafer including a plurality of integrated circuits, in accordance with an embodiment of the present invention.
Figure 6A:
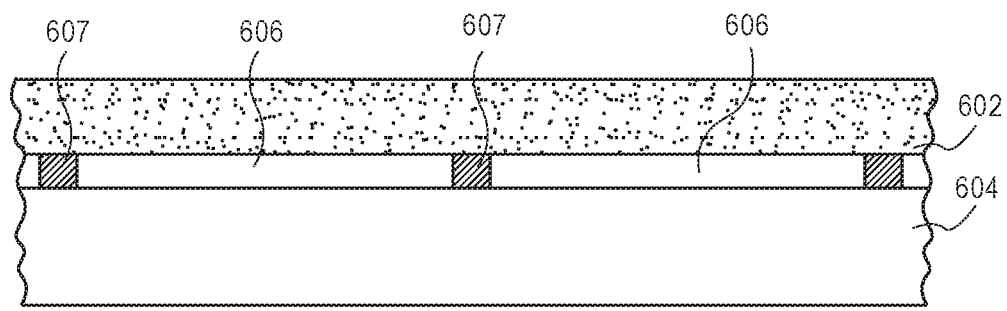
FIG. 6A illustrates a cross-sectional view of a semiconductor wafer including a plurality of integrated circuits during performing of a method of dicing the semiconductor wafer, corresponding to operation 502 of the Flowchart of FIG. 5, in accordance with an embodiment of the present invention.
Figure 6B:
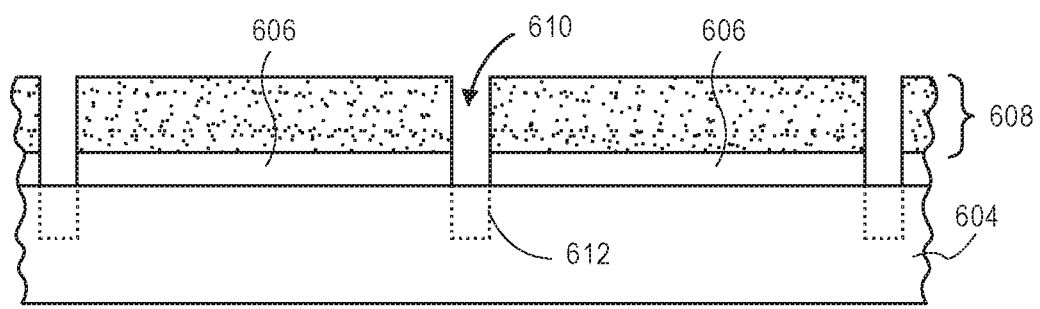
FIG. 6B illustrates a cross-sectional view of a semiconductor wafer including a plurality of integrated circuits during performing of a method of dicing the semiconductor wafer, corresponding to operation 504 of the Flowchart of FIG. 5, in accordance with an embodiment of the present invention.
Figure 6C:
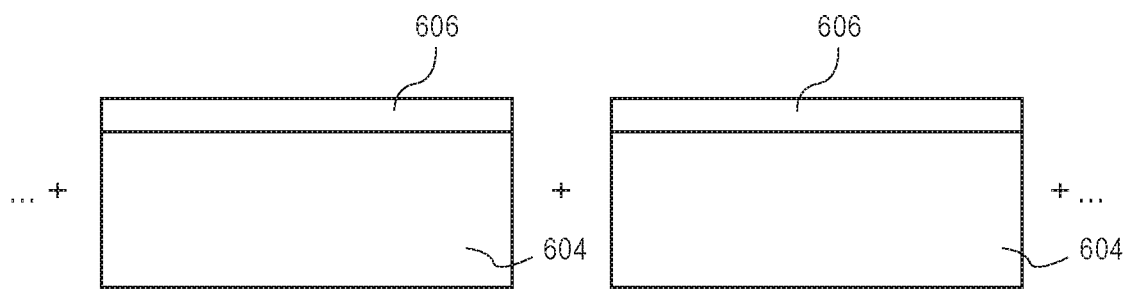
FIG. 6C illustrates a cross-sectional view of a semiconductor wafer including a plurality of integrated circuits during performing of a method of dicing the semiconductor wafer, corresponding to operation 508 of the Flowchart of FIG. 5, in accordance with an embodiment of the present invention.

FIG. 5 is a Flowchart 500 representing operations in a method of dicing a semiconductor wafer including a plurality of integrated circuits, in accordance with an embodiment of the present invention. FIGS. 6A-6C illustrate cross-sectional views of a semiconductor wafer including a plurality of integrated circuits during performing of a method of dicing the semiconductor wafer, corresponding to operations of Flowchart 500, in accordance with an embodiment of the present invention.

Referring to operation 502 of Flowchart 500, and corresponding FIG. 6A, a mask 602 is formed above a semiconductor wafer or substrate 604. The mask 602 is composed of a layer covering and protecting integrated circuits 606 formed on the surface of semiconductor wafer 604. The mask 602 also covers intervening streets 607 formed between each of the integrated circuits 606.

In accordance with an embodiment of the present invention, forming the mask 602 involves forming a layer such as, but not limited to, a photo-resist layer or an I-line patterning layer. For example, a polymer layer such as a photo-resist layer may be composed of a material otherwise suitable for use in a lithographic process. In one embodiment, the photo-resist layer is composed of a positive photo-resist material such as, but not limited to, a 248 nanometer (nm) resist, a 193 nm resist, a 157 nm resist, an extreme ultra-violet (EUV) resist, or a phenolic resin matrix with a diazonaphthoquinone sensitizer. In another embodiment, the photo-resist layer is composed of a negative photo-resist material such as, but not limited to, poly-cis-isoprene and poly-vinyl-cinnamate.

In another embodiment, forming the mask 602 involves forming a layer deposited in a plasma deposition process. For example, in one such embodiment, the mask 602 is composed of a plasma deposited Teflon or Teflon-like (polymeric $CF_2$) layer. In a specific embodiment, the polymeric $CF_2$ layer is deposited in a plasma deposition process involving the gas $C_4F_8$.

In another embodiment, forming the mask 602 involves forming a water-soluble mask layer. In an embodiment, the water-soluble mask layer is readily dissolvable in an aqueous media. For example, in one embodiment, the water-soluble mask layer is composed of a material that is soluble in one or more of an alkaline solution, an acidic solution, or in deionized water. In an embodiment, the water-soluble mask layer maintains its water solubility upon exposure to a heating process, such as heating approximately in the range of 50-160 degrees Celsius. For example, in one embodiment, the water-soluble mask layer is soluble in aqueous solutions following exposure to chamber conditions used in a laser and plasma etch singulation process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble mask layer has an etch rate in an aqueous solution approximately in the range of 1-15 microns per minute and, more particularly, approximately 1.3 microns per minute.

In another embodiment, forming the mask 602 involves forming a UV-curable mask layer. In an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

In an embodiment, semiconductor wafer or substrate 604 is composed of a material suitable to withstand a fabrication process and upon which semiconductor processing layers may suitably be disposed. For example, in one embodiment, semiconductor wafer or substrate 604 is composed of a group IV-based material such as, but not limited to, crystalline silicon, germanium or silicon/germanium. In a specific embodiment, providing semiconductor wafer 604 includes providing a monocrystalline silicon substrate. In a particular embodiment, the monocrystalline silicon substrate is doped with impurity atoms. In another embodiment, semiconductor wafer or substrate 604 is composed of a material such as, e.g., a material substrate used in the fabrication of light emitting diodes (LEDs).

In an embodiment, semiconductor wafer or substrate 604 has disposed thereon or therein, as a portion of the integrated circuits 606, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 606. Materials making up the streets 607 may be similar to or the same as those materials used to form the integrated circuits 606. For example, streets 607 may be composed of layers of dielectric materials, semiconductor materials, and metallization. In one embodiment, one or more of the streets 607 includes test devices similar to the actual devices of the integrated circuits 606.

Referring to operation 504 of Flowchart 500, and corresponding FIG. 6B, the mask 602 is patterned with a laser scribing process to provide a patterned mask 608 with gaps 610, exposing regions of the semiconductor wafer or substrate 604 between the integrated circuits 606. As such, the laser scribing process is used to remove the material of the streets 607 originally formed between the integrated circuits 606. In accordance with an embodiment of the present invention, patterning the mask 602 with the laser scribing process includes forming trenches 612 partially into the regions of the semiconductor wafer 604 between the integrated circuits 606, as depicted in FIG. 6B.

In an embodiment, patterning the mask 606 with the laser scribing process includes using a laser having a pulse width in the femtosecond range, i.e., a femtosecond-based laser scribing process is used. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 602, the streets 607 and, possibly, a portion of the semiconductor wafer or substrate 604.

Figure 7:
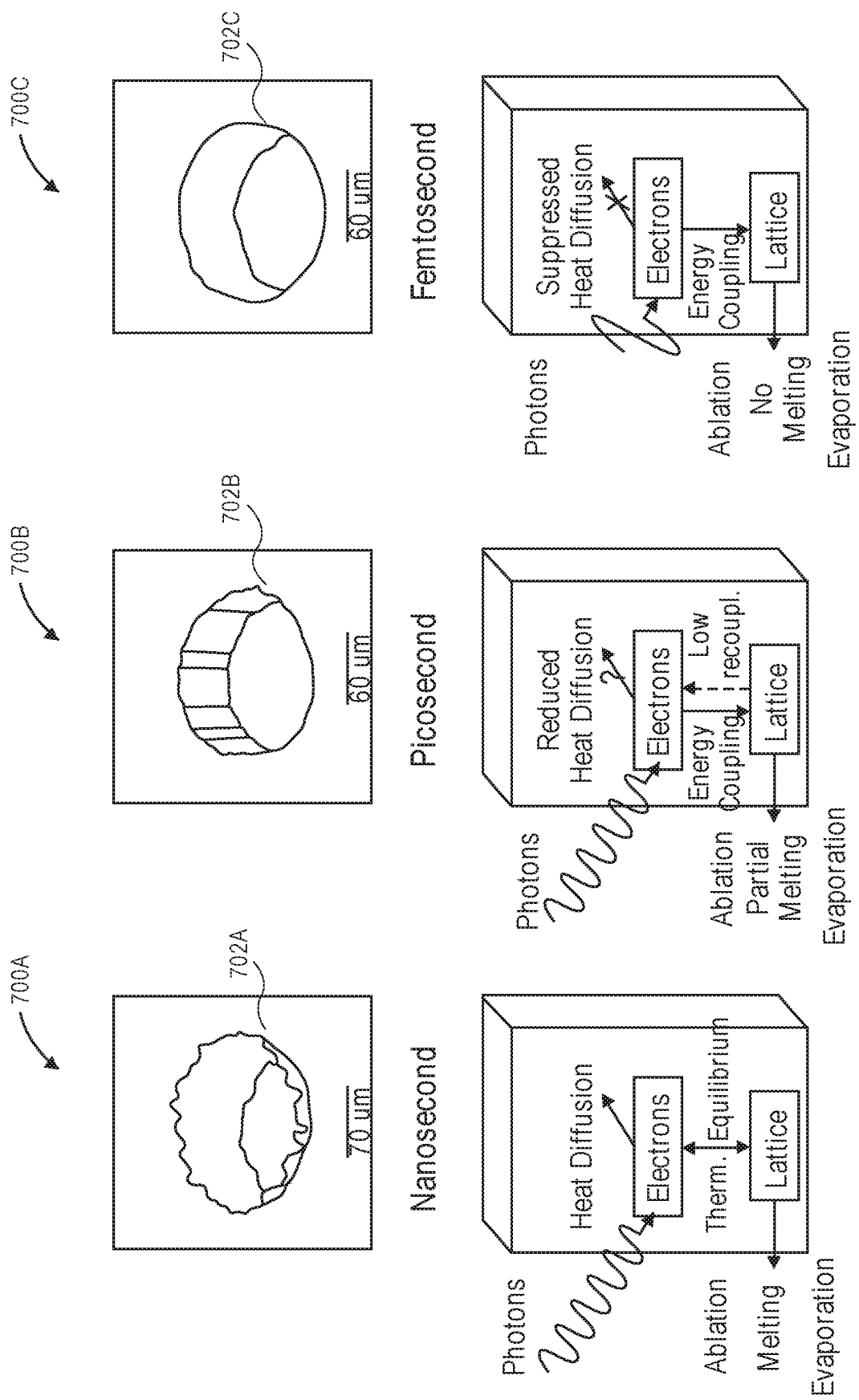
FIG. 7 illustrates the effects of using a laser pulse in the femtosecond range versus longer pulse times, in accordance with an embodiment of the present invention.

FIG. 7 illustrates the effects of using a laser pulse in the femtosecond range versus longer frequencies, in accordance with an embodiment of the present invention. Referring to FIG. 7, by using a laser with a pulse width in the femtosecond range heat damage issues are mitigated or eliminated (e.g., minimal to no damage 702C with femtosecond processing of a via 700C) versus longer pulse widths (e.g., damage 702B with picosecond processing of a via 700B and significant damage 702A with nanosecond processing of a via 700A). The elimination or mitigation of damage during formation of via 700C may be due to a lack of low energy recoupling (as is seen for picosecond-based laser ablation) or thermal equilibrium (as is seen for nanosecond-based laser ablation), as depicted in FIG. 7.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 8 illustrates a cross-sectional view of a stack of materials that may be used in a street region of a semiconductor wafer or substrate, in accordance with an embodiment of the present invention.

Figure 8:
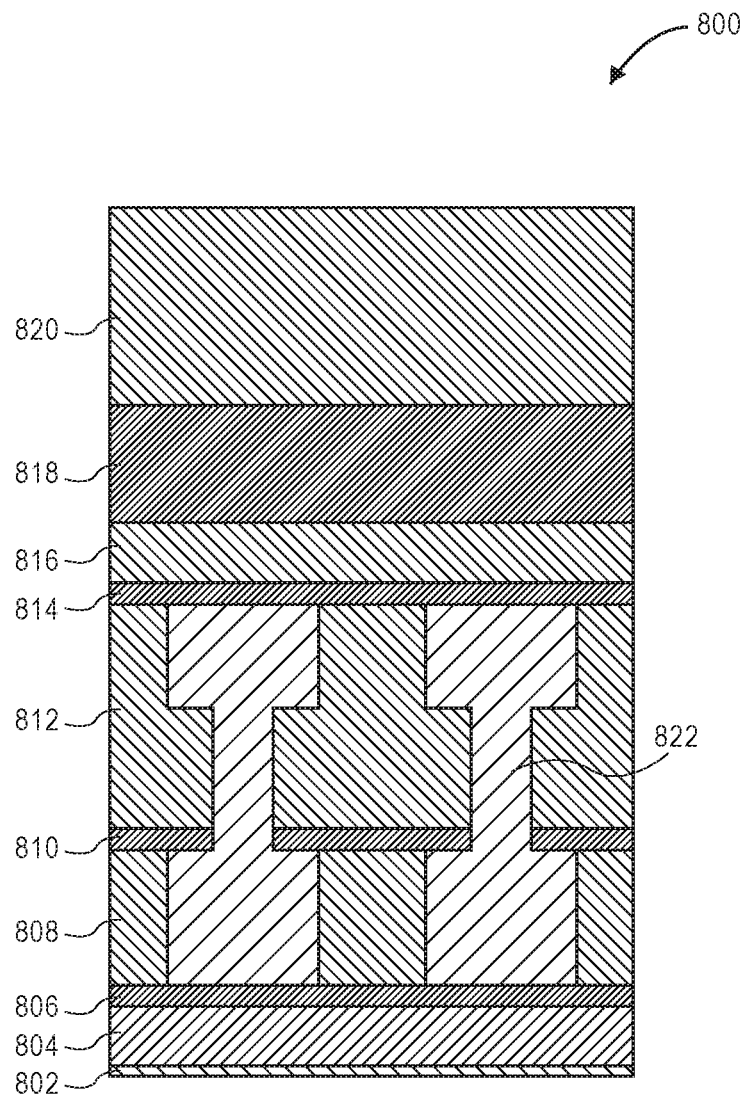
FIG. 8 illustrates a cross-sectional view of a stack of materials that may be used in a street region of a semiconductor wafer or substrate, in accordance with an embodiment of the present invention.

Referring to FIG. 8, a street region 800 includes the top portion 802 of a silicon substrate, a first silicon dioxide layer 804, a first etch stop layer 806, a first low K dielectric layer 808 (e.g., having a dielectric constant of less than the dielectric constant of 4.0 for silicon dioxide), a second etch stop layer 810, a second low K dielectric layer 812, a third etch stop layer 814, an undoped silica glass (USG) layer 816, a second silicon dioxide layer 818, and a mask layer 820, with possible relative thicknesses depicted. Copper metallization 822 is disposed between the first and third etch stop layers 806 and 814 and through the second etch stop layer 810. In a specific embodiment, the first, second and third etch stop layers 806, 810 and 814 are composed of silicon nitride, while low K dielectric layers 808 and 812 are composed of a carbon-doped silicon oxide material.

Figures 9, 10:
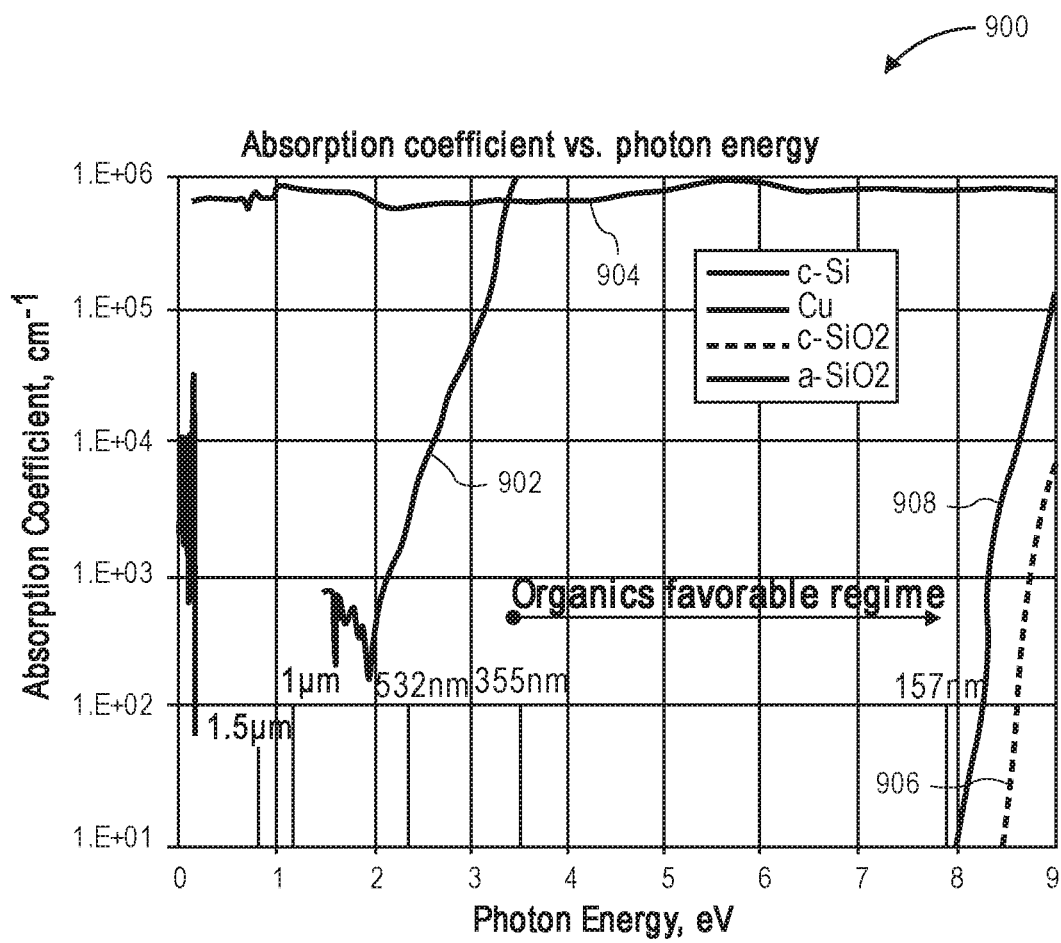
FIG. 9 includes a plot of absorption coefficient as a function of photon energy for crystalline silicon (c-Si), copper (Cu), crystalline silicon dioxide (c-SiO2), and amorphous silicon dioxide (a-SiO2), in accordance with an embodiment of the present invention.
FIG. 10 is an equation showing the relationship of laser intensity for a given laser as a function of laser pulse energy, laser pulse width, and laser beam radius.

Under conventional laser irradiation (such as nanosecond-based or picosecond-based laser irradiation), the materials of street 800 behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. For example, FIG. 9 includes a plot 900 of absorption coefficient as a function of photon energy for crystalline silicon (c-Si, 902), copper (Cu, 904), crystalline silicon dioxide (c-$SiO_2$, 906), and amorphous silicon dioxide (a-$SiO_2$, 908), in accordance with an embodiment of the present invention. FIG. 10 is an equation 1000 showing the relationship of laser intensity for a given laser as a function of laser pulse energy, laser pulse width, and laser beam radius.

Using equation 1000 and the plot 900 of absorption coefficients, in an embodiment, parameters for a femtosecond laser-based process may be selected to have an essentially common ablation effect on the inorganic and organic dielectrics, metals, and semiconductors even though the general energy absorption characteristics of such materials may differ widely under certain conditions. For example, the absorptivity of silicon dioxide is non-linear and may be brought more in-line with that of organic dielectrics, semiconductors and metals under the appropriate laser ablation parameters. In one such embodiment, a high intensity and short pulse width femtosecond-based laser process is used to ablate a stack of layers including a silicon dioxide layer and one or more of an organic dielectric, a semiconductor, or a metal. In a specific embodiment, pulses of approximately less than or equal to 400 femtoseconds are used in a femtosecond-based laser irradiation process to remove a mask, a street, and a portion of a silicon substrate.

By contrast, if non-optimal laser parameters are selected, in a stacked structures that involve two or more of an inorganic dielectric, an organic dielectric, a semiconductor, or a metal, a laser ablation process may cause delamination issues. For example, a laser penetrate through high bandgap energy dielectrics (such as silicon dioxide with an approximately of 9 eV bandgap) without measurable absorption. However, the laser energy may be absorbed in an underlying metal or silicon layer, causing significant vaporization of the metal or silicon layers. The vaporization may generate high pressures to lift-off the overlying silicon dioxide dielectric layer and potentially causing severe interlayer delamination and microcracking. In an embodiment, while picoseconds-based laser irradiation processes lead to microcracking and delaminating in complex stacks, femtosecond-based laser irradiation processes have been demonstrated to not lead to microcracking or delamination of the same material stacks.

In order to be able to directly ablate dielectric layers, ionization of the dielectric materials may need to occur such that they behave similar to a conductive material by strongly absorbing photons. The absorption may block a majority of the laser energy from penetrating through to underlying silicon or metal layers before ultimate ablation of the dielectric layer. In an embodiment, ionization of inorganic dielectrics is feasible when the laser intensity is sufficiently high to initiate photon-ionization and impact ionization in the inorganic dielectric materials.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spacial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring now to operation 506 of Flowchart 500, and again to FIG. 6B, an intermediate breakthrough treatment is performed. In an embodiment, the intermediate breakthrough treatment is a plasma-based process. In one embodiment, the breakthrough treatment includes a first physical bombardment operation, a second iterative isotropic and directional plasma etch operation, and a third directional breakthrough operation.

In an embodiment, the first physical bombardment operation is an Ar-only physical bombardment at a relatively high source power (e.g., greater than approximately 1500 W) and with a bias power (e.g., approximately 200 W) for a duration greater than 10 seconds, and up to approximately 120 seconds. The first physical bombardment operation removes apparent physically attached debris from inside the laser scribed trench. Additionally, condensation of the mask layer on non-trench opening areas may occur in this process which may aid to increase mask etch resistance.

In an embodiment, the second iterative isotropic and directional plasma etch operation involves an iterative isotropic and directional plasma etch process using $SF_6$ gas only. In one embodiment, the directional etch is performed using a power of about 1000 W source and about a 200 W bias power for a duration in the range of 0.4-1.5 second. The isotropic etch portion is non-biased (0 W bias power) for a duration in the range of 0.1 to 0.6 seconds. The isotropic and directional plasma etch processes are alternated iteratively to provide a cyclic etch treatment for a total treatment time in the range of 5 to 60 seconds. In one embodiment, the isotropic portion of the etch process enables cleaning of wavy details that are not directly exposed to the directional plasma etch portion of the treatment.

In an embodiment, the third directional breakthrough operation involves use of a combination of Ar and SF6 gases at an approximately 1500 W source power and approximately 200 W bias. In one embodiment, the third directional breakthrough operation is performed for a duration in the range of 3-10 second. In a particular embodiment, the total amount SF$_6$ is less than 50% of the total SF$_6$/Ar volume and, in a specific embodiment, is approximately 20-40% of the total SF$_6$/Ar volume.

Referring to operation 508 of Flowchart 500, and corresponding FIG. 6C, the semiconductor wafer 604 is etched through the gaps 610 in the patterned mask 608 to singulate the integrated circuits 606. In accordance with an embodiment of the present invention, etching the semiconductor wafer 604 includes etching the trenches 612 formed with the laser scribing process (and possibly extended with a reactive post-mask-opening clean operation) to ultimately etch entirely through semiconductor wafer 604, as depicted in FIG. 6C.

In an embodiment, etching the semiconductor wafer 604 includes using a plasma etching process. In one embodiment, a through-silicon via type etch process is used. For example, in a specific embodiment, the etch rate of the material of semiconductor wafer 604 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 604 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as SF$_6$, C$_4$F$_8$, CHF$_3$, XeF$_2$, or any other reactant gas capable of etching silicon at a relatively fast etch rate. In an embodiment, the mask layer 608 is removed after the singulation process, as depicted in FIG. 6C.

In another embodiment, the plasma etching operation described in association with FIG. 6C employs a conventional Bosch-type dep/etch/dep process to etch through the substrate 604. Generally, a Bosch-type process consists of three sub-operations: deposition, a directional bombardment etch, and isotropic chemical etch which is run through many iterations (cycles) until silicon is etched through. However, as a result of the Bosch process, the sidewall surface takes a scallop structure which can be rough, as illustrated in FIG. 2A. This is particularly the effect where the laser scribing process generates an open trench much rougher than that which a lithographically defined etch process achieves. Such a rough die edge leads to lower than expected die break strength. In addition, the deposition sub-step in a Bosch process generates a Flourine-rich Teflon-type organic film to protect the already etched sidewall which is not removed from the sidewall as the etch front proceeds (generally such polymer is only removed periodically from the bottom of the anisotropically etched trench). Accordingly, following the anisotropic Bosch-type plasma etch operation, the integrated circuits are in singulated form. Subsequently, in an embodiment, an isotropic chemical wet or plasma etch is applied to smoothen the sidewall by gently etching a thin layer of substrate (e.g., silicon) off the side wall. In an embodiment, the isotropic portion of the etching is based on a plasma generated from a combination of NF$_3$ and CF$_4$ as the etchant for sidewall smoothening treatment. Also, a higher bias power such as 1000 W is used. In an embodiment, an advantage of using a plasma generated from a combination of NF$_3$ and CF$_4$ as an etchant for sidewall smoothening lies in the lower isotropic etch rate (~0.15 um/min) so the smoothening treatment is more controllable. The high bias power is applied to achieve relatively high directional etch rates to etch off the ridges or rims on the sidewall.

Accordingly, referring again to Flowchart 500 and FIGS. 6A-6C, wafer dicing may be preformed by initial laser ablation through a mask layer, through wafer streets (including metallization), and partially into a silicon substrate. The laser pulse width may be selected in the femtosecond range. A post mask opening plasma cleaning operation may then be performed. Die singulation may then be completed by subsequent through-silicon deep plasma etching. A specific example of a materials stack for dicing is described below in association with FIGS. 11A-11D, in accordance with an embodiment of the present invention.

Figure 11A:
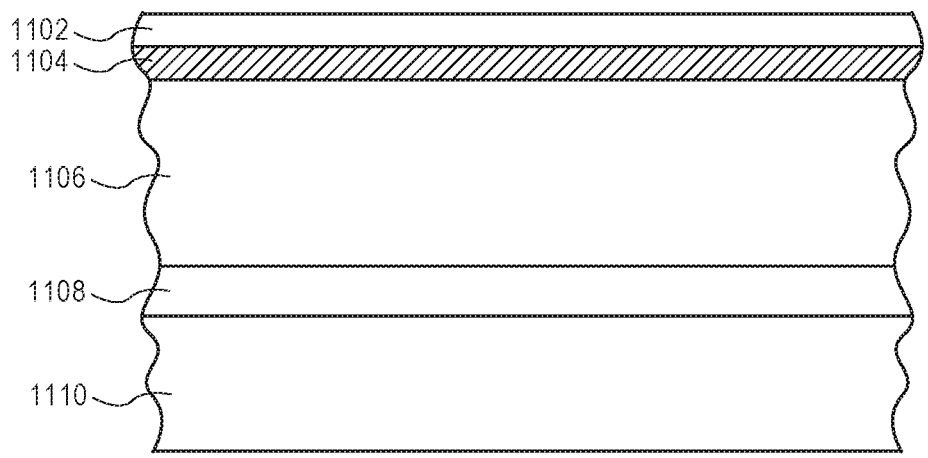
FIGS. 11A-11D illustrate cross-sectional views of various operations in a method of dicing a semiconductor wafer, in accordance with an embodiment of the present invention.

Referring to FIG. 11A, a materials stack for hybrid laser ablation and plasma etch dicing includes a mask layer 1102, a device layer 1104, and a substrate 1106. The mask layer, device layer, and substrate are disposed above a die attach film 1108 which is affixed to a backing tape 1110. In an embodiment, the mask layer 1102 is a photo-resist layer, a plasma-deposited Teflon layer, a water-soluble layer or a UV-curable layer, such as described above in association with mask 602. The device layer 1104 includes an inorganic dielectric layer (such as silicon dioxide) disposed above one or more metal layers (such as copper layers) and one or more low K dielectric layers (such as carbon-doped oxide layers). The device layer 1104 also includes streets arranged between integrated circuits, the streets including the same or similar layers to the integrated circuits. The substrate 1106 is a bulk single-crystalline silicon substrate.

In an embodiment, the bulk single-crystalline silicon substrate 1106 is thinned from the backside prior to being affixed to the die attach film 1108. The thinning may be performed by a backside grind process. In one embodiment, the bulk single-crystalline silicon substrate 1106 is thinned to a thickness approximately in the range of 50-100 microns. It is important to note that, in an embodiment, the thinning is performed prior to a laser ablation, plasma cleaning, and plasma etch dicing process. In an embodiment, the mask layer 1102 has a thickness of approximately 5 microns and the device layer 1104 has a thickness approximately in the range of 2-3 microns. In an embodiment, the die attach film 1108 (or any suitable substitute capable of bonding a thinned or thin wafer or substrate to the backing tape 1110) has a thickness of approximately 20 microns.

Figure 11B:
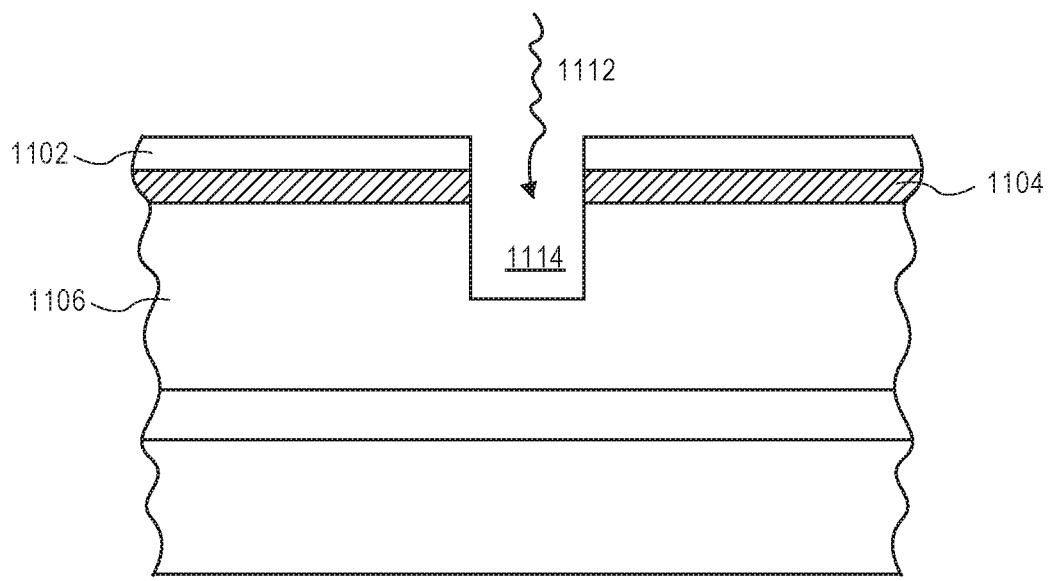
Figure 11C:
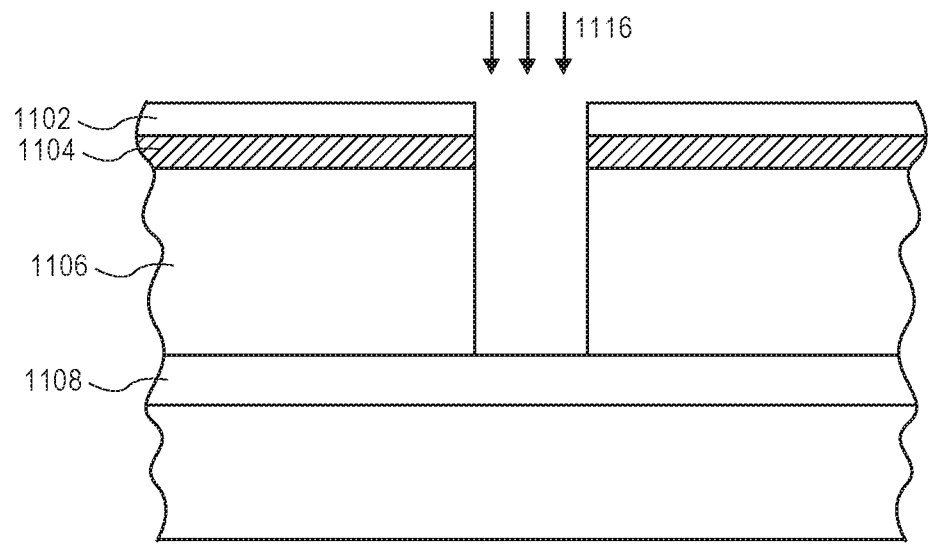

Referring to FIG. 11B, the mask 1102, the device layer 1104 and a portion of the substrate 1106 are patterned with a laser scribing process, such as a femtosecond-based laser scribing process, 1112 to form trenches 1114 in the substrate 1106. Referring to FIG. 11C, a through-silicon deep plasma etch process 1116 is used to extend the trench 1114 down to the die attach film 1108, exposing the top portion of the die attach film 1108 and singulating the silicon substrate 1106. The device layer 1104 is protected by the mask layer 1102 during the through-silicon deep plasma etch process 1116. In an embodiment, a breakthrough treatment is performed after the laser scribing process 1112 and before the through-silicon deep plasma etch process 1116. In one embodiment, the breakthrough treatment includes a first physical bombardment operation, a second iterative isotropic and directional plasma etch operation, and a third directional breakthrough operation, exemplary embodiments of which are described above.

Figure 11D:
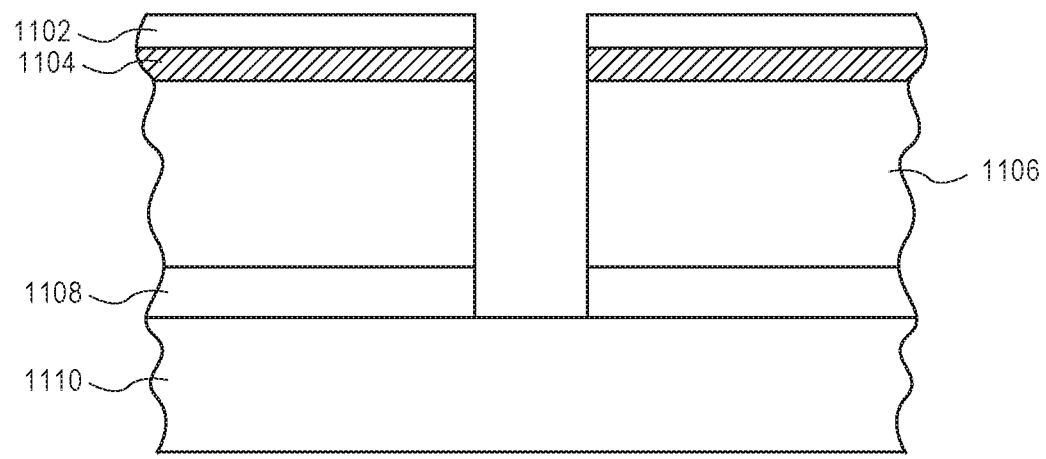

Referring to FIG. 11D, the singulation process may further include patterning the die attach film 1108, exposing the top portion of the backing tape 1110 and singulating the die attach film 1108. In an embodiment, the die attach film is singulated by a laser process or by an etch process. Further embodiments may include subsequently removing the singulated portions of substrate 1106 (e.g., as individual integrated circuits) from the backing tape 1110. In one embodiment, the singulated die attach film 1108 is retained on the back sides of the singulated portions of substrate 1106. Other embodiments may include removing the masking layer 1102 from the device layer 1104. In an embodiment, the singulated integrated circuits are removed from the backing tape 1110 for packaging. In one such embodiment, the patterned die attach film 1108 is retained on the backside of each integrated circuit and included in the final packaging. However, in another embodiment, the patterned die attach film 1108 is removed during or subsequent to the singulation process.

A single process tool may be configured to perform many or all of the operations in a hybrid laser ablation, plasma cleaning, and plasma etch singulation process. For example, FIG. 12 illustrates a block diagram of a tool layout for laser and plasma dicing of wafers or substrates, in accordance with an embodiment of the present invention.

Figure 12:
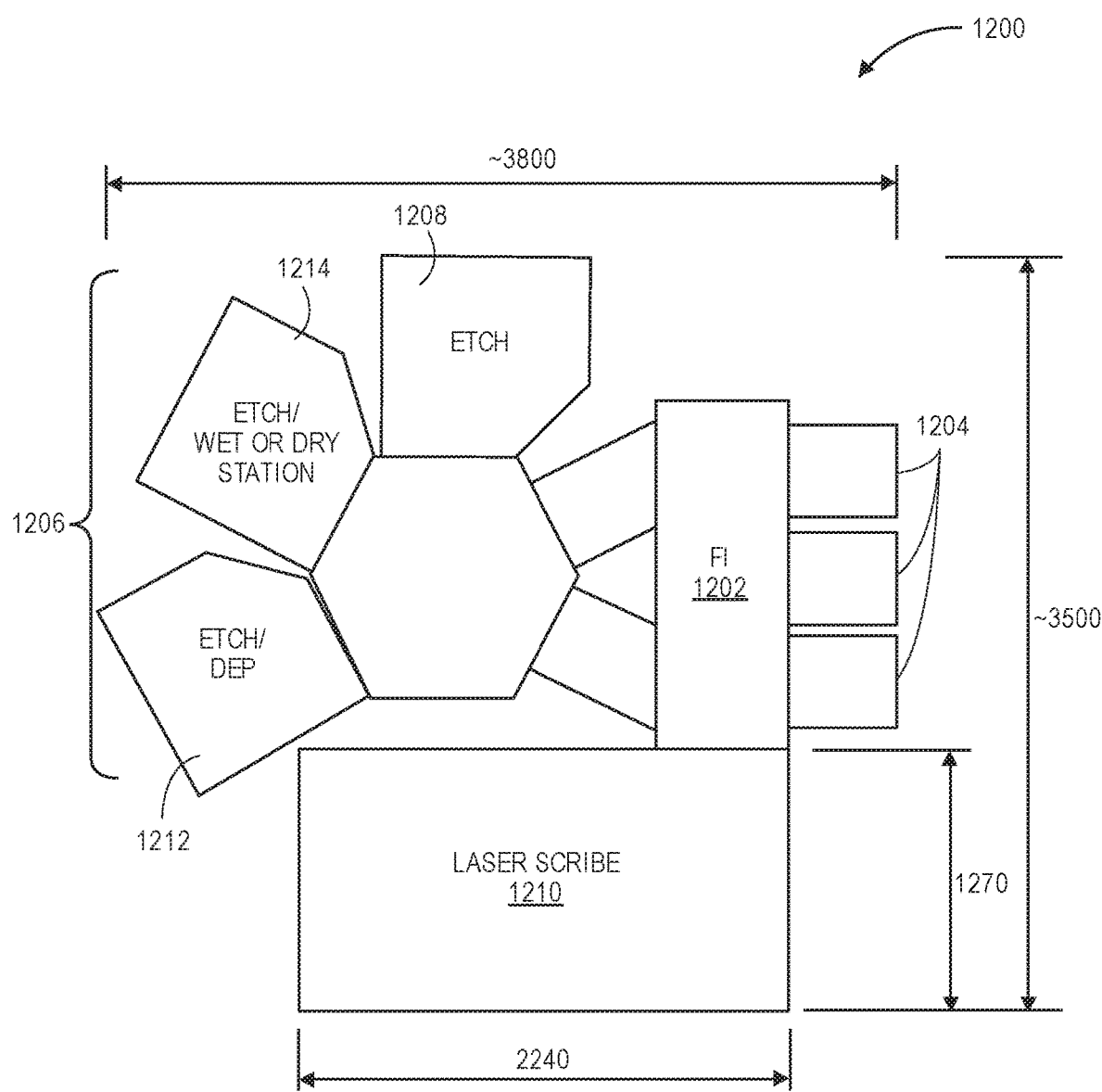
FIG. 12 illustrates a block diagram of a tool layout for laser and plasma dicing of wafers or substrates, in accordance with an embodiment of the present invention.

Referring to FIG. 12, a process tool 1200 includes a factory interface 1202 (FI) having a plurality of load locks 1204 coupled therewith. A cluster tool 1206 is coupled with the factory interface 1202. The cluster tool 1206 includes one or more plasma etch chambers, such as plasma etch chamber 1208. A laser scribe apparatus 1210 is also coupled to the factory interface 1202. The overall footprint of the process tool 1200 may be, in one embodiment, approximately 3500 millimeters (3.5 meters) by approximately 3800 millimeters (3.8 meters), as depicted in FIG. 12.

In an embodiment, the laser scribe apparatus 1210 houses a femtosecond-based laser. The femtosecond-based laser is suitable for performing a laser ablation portion of a hybrid laser and etch singulation process, such as the laser ablation processes described above. In one embodiment, a moveable stage is also included in laser scribe apparatus 1200, the moveable stage configured for moving a wafer or substrate (or a carrier thereof) relative to the femtosecond-based laser. In a specific embodiment, the femtosecond-based laser is also moveable. The overall footprint of the laser scribe apparatus 1210 may be, in one embodiment, approximately 2240 millimeters by approximately 1270 millimeters, as depicted in FIG. 12.

In an embodiment, the one or more plasma etch chambers 1208 is configured for etching a wafer or substrate through the gaps in a patterned mask to singulate a plurality of integrated circuits. In one such embodiment, the one or more plasma etch chambers 1208 is configured to perform a deep silicon etch process. In a specific embodiment, the one or more plasma etch chambers 1208 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 1208 to facilitate high silicon etch rates. In an embodiment, more than one etch chamber is included in the cluster tool 1206 portion of process tool 1200 to enable high manufacturing throughput of the singulation or dicing process. In another embodiment, however, a dedicated plasma etch chamber is configured for performing a breakthrough treatment. In one embodiment, the breakthrough treatment includes a first physical bombardment operation, a second iterative isotropic and directional plasma etch operation, and a third directional breakthrough operation, exemplary embodiments of which are described above.

The factory interface 1202 may be a suitable atmospheric port to interface between an outside manufacturing facility with laser scribe apparatus 1210 and cluster tool 1206. The factory interface 1202 may include robots with arms or blades for transferring wafers (or carriers thereof) from storage units (such as front opening unified pods) into either cluster tool 1206 or laser scribe apparatus 1210, or both.

Cluster tool 1206 may include other chambers suitable for performing functions in a method of singulation. For example, in one embodiment, in place of an additional etch chamber, a deposition chamber 1212 is included. The deposition chamber 1212 may be configured for mask deposition on or above a device layer of a wafer or substrate prior to laser scribing of the wafer or substrate. In one such embodiment, a separate etch chamber is included for performing a reactive plasma cleaning operation, and the deposition chamber 1212 is suitable for depositing a layer of photoresist (PR) or a layer of plasma-deposited Teflon. In another such embodiment, a separate etch chamber is included for performing a non-reactive plasma cleaning operation, and the deposition chamber 1212 is suitable for depositing a layer of water-soluble material. In another embodiment, in place of an additional etch chamber, a wet/dry station 1214 is included. The wet/dry station may be suitable for cleaning residues and fragments, or for removing a mask, subsequent to a laser scribe and plasma etch singulation process of a substrate or wafer. In an embodiment, a metrology station is also included as a component of process tool 1200.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 1200 described in association with FIG. 12. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 13:
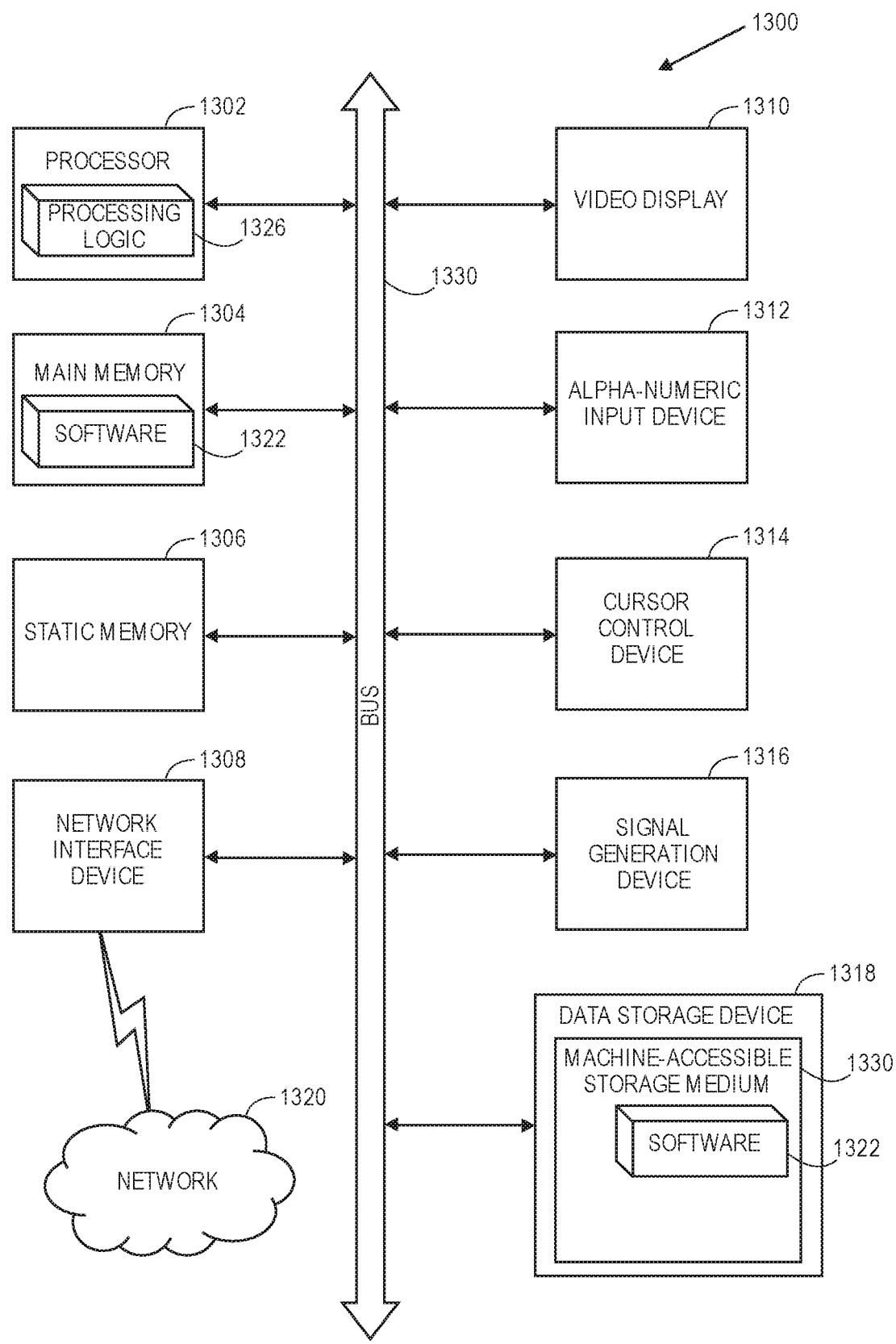
FIG. 13 illustrates a block diagram of an exemplary computer system, in accordance with an embodiment of the present invention.

FIG. 13 illustrates a diagrammatic representation of a machine in the exemplary form of a computer system 1300 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1300 includes a processor 1302, a main memory 1304 (e.g., read-only memory (ROM), flash memory, dynamic random access memory (DRAM) such as synchronous DRAM (SDRAM) or Rambus DRAM (RDRAM), etc.), a static memory 1306 (e.g., flash memory, static random access memory (SRAM), etc.), and a secondary memory 1318 (e.g., a data storage device), which communicate with each other via a bus 1330.

Processor 1302 represents one or more general-purpose processing devices such as a microprocessor, central processing unit, or the like. More particularly, the processor 1302 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1302 may also be one or more special-purpose processing devices such as an application specific integrated circuit (ASIC), a field programmable gate array (FPGA), a digital signal processor (DSP), network processor, or the like. Processor 1302 is configured to execute the processing logic 1326 for performing the operations described herein.

The computer system 1300 may further include a network interface device 1308. The computer system 1300 also may include a video display unit 1310 (e.g., a liquid crystal display (LCD), a light emitting diode display (LED), or a cathode ray tube (CRT)), an alphanumeric input device 1312 (e.g., a keyboard), a cursor control device 1314 (e.g., a mouse), and a signal generation device 1316 (e.g., a speaker).

The secondary memory 1318 may include a machine-accessible storage medium (or more specifically a computer-readable storage medium) 1331 on which is stored one or more sets of instructions (e.g., software 1322) embodying any one or more of the methodologies or functions described herein. The software 1322 may also reside, completely or at least partially, within the main memory 1304 and/or within the processor 1302 during execution thereof by the computer system 1300, the main memory 1304 and the processor 1302 also constituting machine-readable storage media. The software 1322 may further be transmitted or received over a network 1320 via the network interface device 1308.

While the machine-accessible storage medium 1331 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits. The method involves forming a mask above the semiconductor wafer, the mask including a layer covering and protecting the integrated circuits. The mask is patterned with a laser scribing process to provide a patterned mask with gaps, exposing regions of the semiconductor wafer between the integrated circuits. Subsequent to patterning the mask, a breakthrough treatment is performed, the breakthrough treatment comprising a first physical bombardment operation, a second iterative isotropic and directional plasma etch operation, and a third directional breakthrough operation. Subsequent to performing the breakthrough treatment, the semiconductor wafer is plasma etched through the gaps in the patterned mask to singulate the integrated circuits.

Thus, methods of dicing semiconductor wafers, each wafer having a plurality of integrated circuits, have been disclosed.

What is claimed is:

1. A method of dicing a semiconductor wafer comprising a plurality of integrated circuits, the method comprising:
   forming a mask above the semiconductor wafer, the mask comprising a layer covering and protecting the integrated circuits;
   patterning the mask with a laser scribing process to provide a patterned mask with gaps, exposing regions of the semiconductor wafer between the integrated circuits;
   subsequent to patterning the mask, performing a breakthrough treatment, the breakthrough treatment comprising a first physical bombardment operation, a second iterative isotropic and directional plasma etch operation subsequent to the first physical bombardment operation, and a third directional breakthrough operation subsequent to the second iterative isotropic and directional plasma etch operation; and
   subsequent to performing the breakthrough treatment, plasma etching the semiconductor wafer through the gaps in the patterned mask to singulate the integrated circuits.

2. The method of claim 1, wherein the first physical bombardment operation of the breakthrough treatment comprises an Ar-only physical bombardment process performed at a source power greater than approximately 1500 W, with a bias power of approximately 200 W for a duration between 10 seconds and 120 seconds.

3. The method of claim 1, wherein the first physical bombardment operation of the breakthrough treatment removes physically attached debris from the gaps.

4. The method of claim 1, wherein the second iterative isotropic and directional plasma etch operation of the breakthrough treatment comprises an iterative isotropic and directional plasma etch process using $SF_6$ gas only, wherein the directional etch is performed using a power of approximately 1000 W source and approximately a 200 W bias power for a duration in the range of 0.4-1.5 second, and wherein the isotropic etch portion is performed using approximately 0W bias power for a duration in the range of 0.1 to 0.6 seconds.

5. The method of claim 4, wherein the isotropic and directional plasma etch processes are alternated iteratively to provide a cyclic etch treatment for a total treatment time in the range of 5 to 60 seconds.

6. The method of claim 1, wherein the third directional breakthrough operation of the breakthrough treatment comprises a combination of Ar and SF6 gases at an approximately 1500 W source power and approximately 200 W bias and is performed for a duration in the range of 3-10 seconds.

7. The method of claim 6, wherein a total amount $SF_6$ is approximately 20-40% of a total $SF_6$/Ar volume.

8. The method of claim 1, wherein the first physical bombardment operation of the breakthrough treatment comprises an Ar-only physical bombardment process performed at a source power greater than approximately 1500 W, with a bias power of approximately 200 W for a duration between 10 seconds and 120 seconds, wherein the second iterative isotropic and directional plasma etch operation of the breakthrough treatment comprises an iterative isotropic and directional plasma etch process using $SF_6$ gas only, wherein the directional etch is performed using a power of approximately 1000 W source and approximately a 200 W bias power for a duration in the range of 0.4-1.5 second, and wherein the isotropic etch portion is performed using approximately 0W bias power for a duration in the range of 0.1 to 0.6 seconds, and wherein the third directional breakthrough operation of the breakthrough treatment comprises a combination of Ar and SF6 gases at an approximately 1500 W source power and approximately 200 W bias and is performed for a duration in the range of 3-10 seconds.

9. A system for dicing a semiconductor wafer comprising a plurality of integrated circuits, the system comprising:
 a factory interface;
 a laser scribe apparatus coupled with the factory interface and comprising a laser;
 a first plasma etch chamber coupled with the factory interface, the first plasma etch chamber configured for performing a breakthrough treatment, the breakthrough treatment comprising a first physical bombardment operation, a second iterative isotropic and directional plasma etch operation subsequent to the first physical bombardment operation, and a third directional breakthrough operation subsequent to the second iterative isotropic and directional plasma etch operation; and
 a second plasma etch chamber coupled with the factory interface, the second plasma etch chamber configured for performing a deep silicon plasma etch operation.

10. The system of claim 9, wherein the first physical bombardment operation of the breakthrough treatment comprises an Ar-only physical bombardment process performed at a source power greater than approximately 1500 W, with a bias power of approximately 200 W for a duration between 10 seconds and 120 seconds.

11. The system of claim 9, wherein the first physical bombardment operation of the breakthrough treatment removes physically attached debris from the gaps.

12. The system of claim 9, wherein the second iterative isotropic and directional plasma etch operation of the breakthrough treatment comprises an iterative isotropic and directional plasma etch process using $SF_6$ gas only, wherein the directional etch is performed using a power of approximately 1000 W source and approximately a 200 W bias power for a duration in the range of 0.4-1.5 second, and wherein the isotropic etch portion is performed using approximately 0W bias power for a duration in the range of 0.1 to 0.6 seconds.

13. The system of claim 12, wherein the isotropic and directional plasma etch processes are alternated iteratively to provide a cyclic etch treatment for a total treatment time in the range of 5 to 60 seconds.

14. The system of claim 9, wherein the third directional breakthrough operation of the breakthrough treatment comprises a combination of Ar and $SF_6$ gases at an approximately 1500 W source power and approximately 200 W bias and is performed for a duration in the range of 3-10 seconds.

15. The system of claim 14, wherein a total amount $SF_6$ is approximately 20-40% of a total $SF_6$/Ar volume.

16. The system of claim 9, wherein the first physical bombardment operation of the breakthrough treatment comprises an Ar-only physical bombardment process performed at a source power greater than approximately 1500 W, with a bias power of approximately 200 W for a duration between 10 seconds and 120 seconds, wherein the second iterative isotropic and directional plasma etch operation of the breakthrough treatment comprises an iterative isotropic and directional plasma etch process using $SF_6$ gas only, wherein the directional etch is performed using a power of approximately 1000 W source and approximately a 200 W bias power for a duration in the range of 0.4-1.5 second, and wherein the isotropic etch portion is performed using approximately 0W bias power for a duration in the range of 0.1 to 0.6 seconds, and wherein the third directional breakthrough operation of the breakthrough treatment comprises a combination of Ar and $SF_6$ gases at an approximately 1500 W source power and approximately 200 W bias and is performed for a duration in the range of 3-10 seconds.

17. A method of dicing a semiconductor wafer comprising a plurality of integrated circuits, the method comprising:
 forming a mask layer above a silicon substrate, the mask layer covering and protecting integrated circuits disposed on the silicon substrate, the integrated circuits comprising a layer of silicon dioxide disposed above a layer of low K material and a layer of copper;
 patterning the mask layer, the layer of silicon dioxide, the layer of low K material, the layer of copper, and a portion of the silicon substrate with a laser scribing process to expose regions of the silicon substrate between the integrated circuits;
 subsequent to performing the laser scribing process, performing a breakthrough treatment, the breakthrough treatment comprising a first physical bombardment operation, a second iterative isotropic and directional plasma etch operation subsequent to the first physical bombardment operation, and a third directional breakthrough operation subsequent to the second iterative isotropic and directional plasma etch operation; and
 subsequent to performing the breakthrough treatment, plasma etching the silicon substrate through the exposed regions of the silicon substrate to singulate the integrated circuits.

18. The method of claim 17, wherein the first physical bombardment operation of the breakthrough treatment comprises an Ar-only physical bombardment process performed at a source power greater than approximately 1500 W, with a bias power of approximately 200 W for a duration between 10 seconds and 120 seconds.

19. The method of claim 18, wherein the second iterative isotropic and directional plasma etch operation of the breakthrough treatment comprises an iterative isotropic and directional plasma etch process using $SF_6$ gas only, wherein the directional etch is performed using a power of approximately 1000 W source and approximately a 200 W bias power for a duration in the range of 0.4-1.5 second, and wherein the isotropic etch portion is performed using approximately 0W bias power for a duration in the range of 0.1 to 0.6 seconds.

20. The method of claim 19, wherein the third directional breakthrough operation of the breakthrough treatment comprises a combination of Ar and $SF_6$ gases at an approximately 1500 W source power and approximately 200 W bias and is performed for a duration in the range of 3-10 seconds.

* * * * *